United States Patent
Yang et al.

(10) Patent No.: US 7,528,066 B2
(45) Date of Patent: May 5, 2009

(54) STRUCTURE AND METHOD FOR METAL INTEGRATION

(75) Inventors: Chih-Chao Yang, Poughkeepsie, NY (US); Terry A. Spooner, New Fairfield, CT (US); Oscar van der Straten, Mohegan Lake, NY (US)

(73) Assignee: International Business Machines Corporation, Armonk, NY (US)

( * ) Notice: Subject to any disclaimer, the term of this patent is extended or adjusted under 35 U.S.C. 154(b) by 179 days.

(21) Appl. No.: 11/364,953

(22) Filed: Mar. 1, 2006

(65) Prior Publication Data

US 2007/0205482 A1    Sep. 6, 2007

(51) Int. Cl.
*H01L 21/311*    (2006.01)
*H01L 21/4763*    (2006.01)

(52) U.S. Cl. ............... 438/645; 438/618; 438/620; 438/622; 438/631; 438/637; 438/643; 438/648; 438/702

(58) Field of Classification Search ......... 438/618–622, 438/637, 641–644, 650, 700–703
See application file for complete search history.

(56) References Cited

U.S. PATENT DOCUMENTS

| | | | |
|---|---|---|---|
| 4,184,909 A | 1/1980 | Chang et al. | |
| 5,470,790 A | 11/1995 | Myers et al. | |
| 5,933,753 A | 8/1999 | Simon et al. | |
| 5,985,762 A | 11/1999 | Geffken et al. | |
| 6,429,519 B1 | 8/2002 | Uzoh | |
| 6,436,814 B1* | 8/2002 | Horak et al. | 438/637 |
| 6,784,105 B1 | 8/2004 | Yang et al. | |
| 7,217,663 B2* | 5/2007 | Huang et al. | 438/700 |
| 2002/0072223 A1 | 6/2002 | Gilbert et al. | |
| 2003/0087514 A1* | 5/2003 | Tang et al. | 438/630 |
| 2004/0266201 A1 | 12/2004 | Wille et al. | |
| 2005/0112864 A1* | 5/2005 | Clevenger et al. | 438/622 |
| 2005/0282346 A1 | 12/2005 | Barth et al. | |
| 2006/0019485 A1 | 1/2006 | Komai et al. | |
| 2007/0202689 A1* | 8/2007 | Choi et al. | 438/637 |

OTHER PUBLICATIONS

Liang, Mong-Song, "Challenges in Cu/Low-K Integration." *IEEE* (2004).

Edelstein, D., "Comprehensive Reliability Evaluation of a 90 nm CMOS Technology with Cu/PECVD Low-K BEOL." IBM Semiconductor Research and Development Center (2004).

* cited by examiner

*Primary Examiner*—Matthew Smith
*Assistant Examiner*—Phillip Green
(74) *Attorney, Agent, or Firm*—Scully, Scott, Murphy & Presser, P.C.; Daniel P. Morris, Esq.

(57) ABSTRACT

An interconnect structure including a gouging feature at the bottom of one of the via openings and a method of forming the same are provided. In accordance with the present invention, the method of forming the interconnect structure does not disrupt the coverage of the deposited diffusion barrier in the overlying line opening, nor does it introduce damages caused by Ar sputtering into the dielectric material including the via and line openings. In accordance with the present invention, such an interconnect structure contains a diffusion barrier layer only within the via opening, but not in the overlying line opening. This feature enhances both mechanical strength and diffusion property around the via opening areas without decreasing volume fraction of conductor inside the line openings. In accordance with the present invention, such an interconnect structure is achieved by providing the gouging feature in the bottom of the via opening prior to formation of the line opening and deposition of the diffusion barrier in said line opening.

14 Claims, 14 Drawing Sheets

STRUCTURE AND METHOD FOR METAL INTEGRATION

FIELD OF THE INVENTION

The present invention relates to a semiconductor structure and a method of fabricating the same. More particularly, the present invention relates to an interconnect structure containing a continuous diffusion barrier within a line opening that is located above a via opening and a method of fabricating such a semiconductor structure. The continuous diffusion barrier is formed after providing a gouging feature into a conductive feature that is located beneath the via opening. Because of this, no damages are introduced into the dielectric material during formation of the gouging feature.

BACKGROUND OF THE INVENTION

Generally, semiconductor devices include a plurality of circuits which form an integrated circuit fabricated on a semiconductor substrate. A complex network of signal paths will normally be routed to connect the circuit elements distributed on the surface of the substrate. Efficient routing of these signals across the device requires formation of multilevel or multilayered schemes, such as, for example, single or dual damascene wiring structures. Within a typical interconnect structure, metal vias run perpendicular to the semiconductor substrate and metal lines run parallel to the semiconductor substrate.

As millions and millions of devices and circuits are squeezed on a semiconductor chip, the wiring density and the number of metal levels are both increased generation after generation. In order to provide low RC for high signal speed, low k dielectric materials having a dielectric constant of less than silicon dioxide as well as copper-containing lines are becoming a necessity. The quality of thin metal wirings and studs formed by a conventional damascene process is extremely important to ensure yield and reliability. The major problem encountered in this area today is poor mechanical integrity of deep submicron metal studs embedded in low k dielectric materials, which can cause unsatisfied thermal cycling and stress migration resistance in interconnect structures. This problem becomes more severe when either new metallization approaches or porous low k dielectric materials are used.

To solve this weak mechanical strength issue while employing copper damascene and low k dielectric materials in an interconnect structure, a so called "via punch-through" technique has been adopted by the semiconductor industry. The via punch-thorough provides a via-gouging feature (or anchoring area) within the interconnect structure. Such a via-gouging feature is reported to achieve a reasonable contact resistance as well as an increased mechanical strength of the contact stud. These findings have been reported, for example, in M. -Si. Liang "Challenges in Cu/Low k Integration", IEEE Int. Electron Devices Meeting, 313 (2004), D. Edelstein et al. "Comprehensive Reliability Evaluation of a 90 nm CMOS Technology with Cu/PECVD Low k BEOL", IEEE Int. Reliability Physics Symp., 316 (2004), and U.S. Pat. No. 4,184,909 to Chang et al., U.S. Pat. No. 5,933,753 to Simon et al., U.S. Pat. No. 5,985,762 to Geffken et al., U.S. Pat. No. 6,429,519 to Uzoh et al. and U.S. Pat. No. 6,784,105 to Yang et al.

However, the argon sputtering technique that is used to create via gouging in the prior art not only removes the deposited liner material, e.g., TaN, from the trench (i.e., line opening) bottom, but also damages the low k dielectric material. Because of the requirement of creating the gouging feature, the final interconnect structure not only has poor liner coverage at the trench bottom, but severe damage has been introduced into the low k dielectric material from the Ar sputtering process. This becomes a major yield detractor and a reliability concern for advanced chip manufacturing.

The detailed processing steps of the existing prior art approach for via gouging are illustrated in FIGS. 1A-1E and are described herein below. Reference is first made to FIG. 1A which illustrates a prior art structure that is formed after dual damascene patterning of an upper interconnect level 108 which is located atop a lower interconnect level 100. The lower interconnect level 100 includes a first low k dielectric material 102 which includes a metallic, Cu, feature 104 therein. The lower interconnect level 100 is separated in part from the upper interconnect level 108 by a capping layer 106. The upper interconnect level 108 includes a second low k dielectric material 110 that includes both line 112 and via 114 openings located therein. A surface of the metallic feature 104 of the lower interconnect level 100 that is beneath the via opening 114 is exposed as is shown in FIG. 1A.

FIG. 1B shows the prior art structure of FIG. 1A after forming a diffusion barrier, e.g., TaN, 116 over all of the exposed surfaces. Argon sputtering, such as is shown in FIG. 1C, is then performed to clean the bottom horizontal surface within the via opening 114 and form a gouging feature (i.e., anchoring area) 118 into the metallic feature 104 of the lower interconnect level 100. The gouging feature 118 is employed to enhance the interconnect strength between the various interconnect levels shown. During the Ar sputtering process, the diffusion barrier 116 is removed from the bottom of each of the line openings 112, and dielectric damages 120 (which are indicated by circles in the second low k dielectric material 110) are formed at the bottom of each of the line openings 112. The dielectric damages 120 formed during the sputtering process are due to the inherent aggressive nature of prior art sputtering processes.

FIG. 1D shows the prior art structure of FIG. 1C after forming a metal liner layer, e.g., Ta, Ru, Ir, Rh or Pt, 122 on the exposed surfaces thereof. FIG. 1E illustrates the prior art structure after filling the line and via openings (112 and 114, respectively) with a conductive metal, e.g., Cu, 124 and planarization. As shown in FIG. 1E, the prior art structure has poor diffusion barrier 116 coverage (designated by reference numeral 126) at the bottom of the metallic filled lines and a feature-bottom roughness which is a result of the damages 120 formed into the second low k dielectric material 110. Both of these characteristics reduce the quality of the diffusion barrier 116 and degrade the overall wiring reliability. Moreover, both of the aforementioned characteristics result in the structure exhibiting a high-level of metal-to-metal leakage.

Porous ultra-low k dielectric materials (having a dielectric constant of about 2.8 or less) have been developed and have been used in interconnect structures as one of the interlevel dielectrics. As compared to dense (i.e., non-porous) low k dielectrics, the damage impact of argon sputtering is much higher on most ultra-low k dielectric materials tested, which makes integration of the current metallization approach (See FIGS. 1A-1E, for example) with ultra-low k dielectric materials nearly impossible. As a result, all of the current ultra-low k hardware has failed during barrier integrity testing. A scanning electron micrograph (SEM) cross sectional of a prior art interconnect structure with Cu interconnects in an ultra-low k dielectric is shown in FIG. 2. The arrows included in the SEM image point to the damages formed into the ultra-low k dielectric material during Ar sputtering.

In view of the above drawbacks with prior art interconnect structures, and particularly in those including a porous ultra-low k dielectric as one of the interlevel dielectric materials, there is a continued need for developing a new and improved integration scheme that avoids removal of the diffusion barrier from the horizontal surfaces of the line openings formed into a dielectric material (including low k and ultra-low k) and thereby not introducing damages into the dielectric material.

SUMMARY OF THE INVENTION

The present invention provides an interconnect structure including a gouging feature at the bottom of the via openings and a method of forming the same, which does not disrupt the coverage of the deposited diffusion barrier in the overlying line opening, nor does the inventive method introduce damages caused by Ar sputtering into the dielectric material that includes the via and line openings. In accordance with the present invention, such an interconnect structure is achieved by providing the gouging feature in the bottom of the via opening prior to formation of the line opening and deposition of the diffusion barrier in said line opening.

Since diffusion barrier coverage is continuous in the line regions of the inventive interconnect structure and no damages are introduced into the interconnect dielectric material, the inventive interconnect structure has an improved wiring reliability and a lower-level of metal-to-metal leakage than the prior interconnect structure which is fabricated utilizing the processing flow shown in FIGS. 1A-1E.

In one embodiment of the present invention, the invention provides a semiconductor structure that comprises:
a lower interconnect level including a first dielectric material having at least one conductive feature embedded therein;
a dielectric capping layer located on said first dielectric material and some, but not all, portions of the at least one conductive feature; and
an upper interconnect level including a second dielectric material having at least one conductively filled via and an overlying conductively filled line disposed therein, wherein said conductively filled via is in contact with an exposed surface of the at least one conductive feature of said first interconnect level by an anchoring area,
said conductively filled via is separated from said second dielectric material by a first diffusion barrier layer, and
said conductively filled line is separated from said second dielectric material by a second continuous diffusion barrier layer thereby the second dielectric material includes no damaged regions in areas adjacent to said conductively filled line.

In a preferred embodiment of the present invention, the interconnect structure includes vias and lines that are filled with Cu or a Cu-containing alloy, and the first and second dielectric materials are the same or different porous dielectric materials having a dielectric constant of about 2.8 or less.

In yet another embodiment of the present invention, the present invention provides a semiconductor structure comprising:
a lower interconnect level including a first dielectric material having at least one conductive feature embedded therein;
a dielectric capping layer located on said first dielectric material and some, but not all, portions of the at least one conductive feature; and
an upper interconnect level including a second dielectric material having at least one conductively filled via and an overlying conductively filled line disposed therein, wherein said conductively filled via is in contact with said at least one conductive feature in said at least one first interconnect level by an anchoring area,
a metallic interfacial layer located at a surface of said anchoring area and is in contact with said conductively filled via,
said conductively filled via is separated from said second dielectric material by a first diffusion barrier layer, and
said conductively filled line is separated from said second dielectric material by a second continuous diffusion barrier layer thereby the second dielectric material includes no damaged regions in areas adjacent to said conductively filled line.

In addition to providing the aforementioned semiconductor structures, the present invention also provides a method of fabricating the same. In one embodiment of the present invention, the method includes:
providing an initial interconnect structure that includes a lower interconnect level comprising a first dielectric layer having at least one conductive feature embedded therein, an upper interconnect level comprising a second dielectric having at least one via opening that exposes a portion of said at least one conductive feature located atop said lower interconnect level, said lower and upper interconnect levels are separated in part by a dielectric capping layer, and a patterned hard mask on a surface of the said upper interconnect level;
forming a first barrier layer on all exposed surfaces of the initial interconnect structure;
forming a punch-through gouging feature in said at least one conductive feature that is located at the bottom of said via opening;
forming at least one line opening in said second dielectric material that extends above said at least one via opening;
forming a second continuous diffusion barrier layer at least within said at least one line opening;
forming an adhesion/plating seed layer within both said at least one line opening and said at least one via opening; and
filling said at least one line opening and at least one via opening with a conductive material.

In a preferred embodiment of the present invention, the method of the present invention includes filling the vias and lines with Cu or a Cu-containing alloy, and using a porous dielectric material having a dielectric constant of about 2.8 or less as both the first and second dielectric.

In yet another embodiment of the present invention, the method includes the steps of:
providing an initial interconnect structure that includes a lower interconnect level comprising a first dielectric layer having at least one conductive feature embedded therein, an upper interconnect level comprising a second dielectric having at least one via opening that exposes a portion of said at least one conductive feature located atop said lower interconnect level, said lower and upper interconnect levels are separated in part by a dielectric capping layer, and a patterned hard mask on a surface of the said upper interconnect level;
forming a first barrier layer on all exposed surfaces of the initial interconnect structure;
forming a punch-through gouging feature in said at least one conductive feature that is located at the bottom of said via opening;
forming a metallic interfacial layer atop said gouging feature;
forming at least one line opening in said second dielectric material that extends above said at least one via opening;
removing etching residues from said at least one line opening and from said at least one via opening;
forming a second continuous diffusion barrier layer at least within said at least one line opening;

forming an adhesion/plating seed layer within both said at least one line opening and said at least one via opening; and filling said at least one line opening and at least one via opening with a conductive material.

DETAILED DESCRIPTION OF THE INVENTION

The present invention, which provides an interconnect structure including a gouged via feature (i.e., anchored via bottom) and a method of fabricating the same, will now be described in greater detail by referring to the following discussion and drawings that accompany the present application. The drawings of the present application, which are referred to herein below in greater detail, are provided for illustrative purposes and, as such, they are not drawn to scale.

Figure 1A:
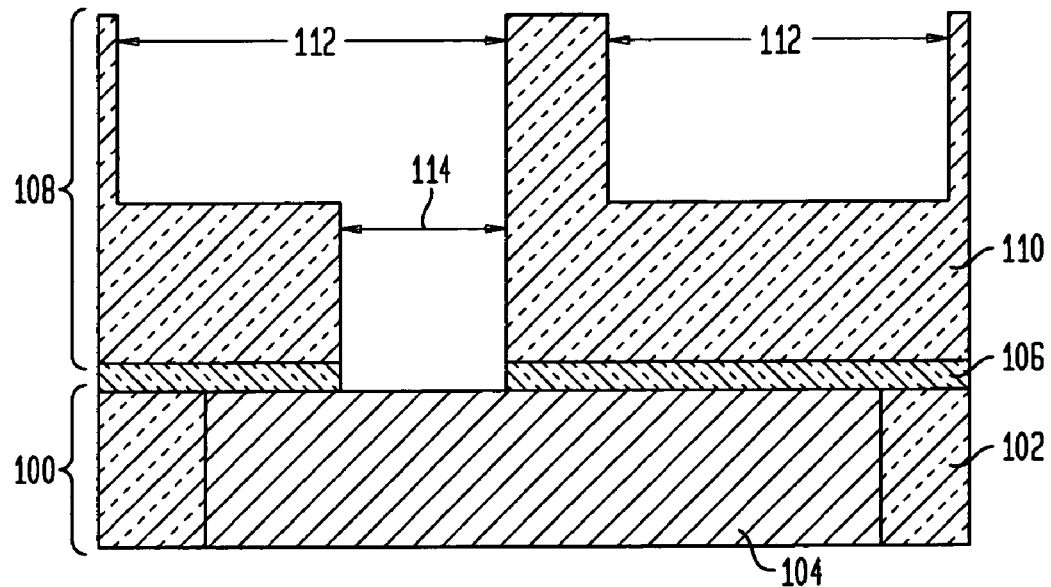
FIGS. 1A-1E are pictorial representations (through cross sectional views) illustrating the basic processing steps used in the prior art in forming an interconnect structure.
Figure 1B:
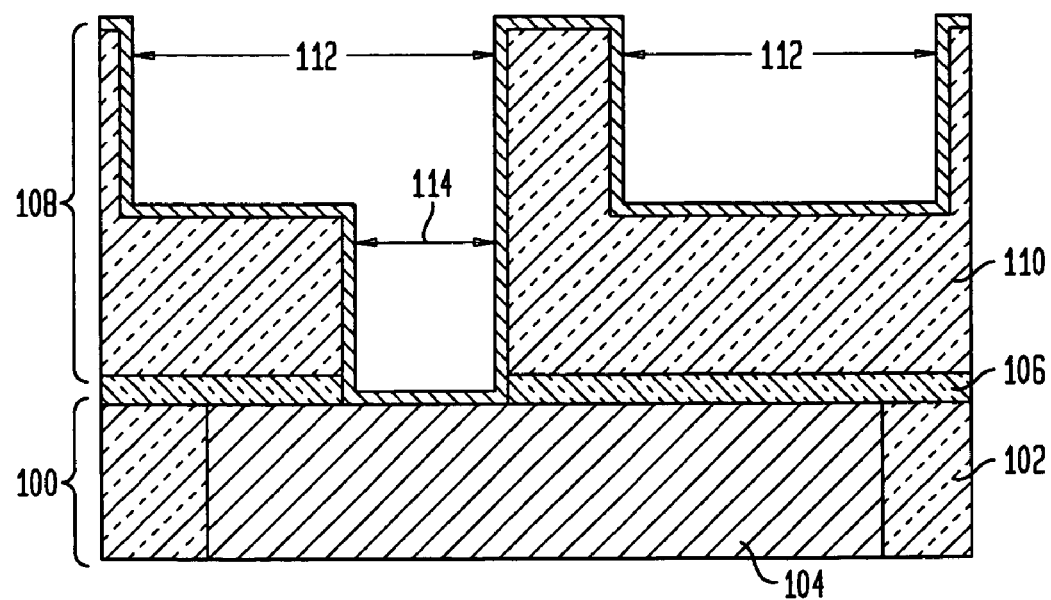
Figure 1C:
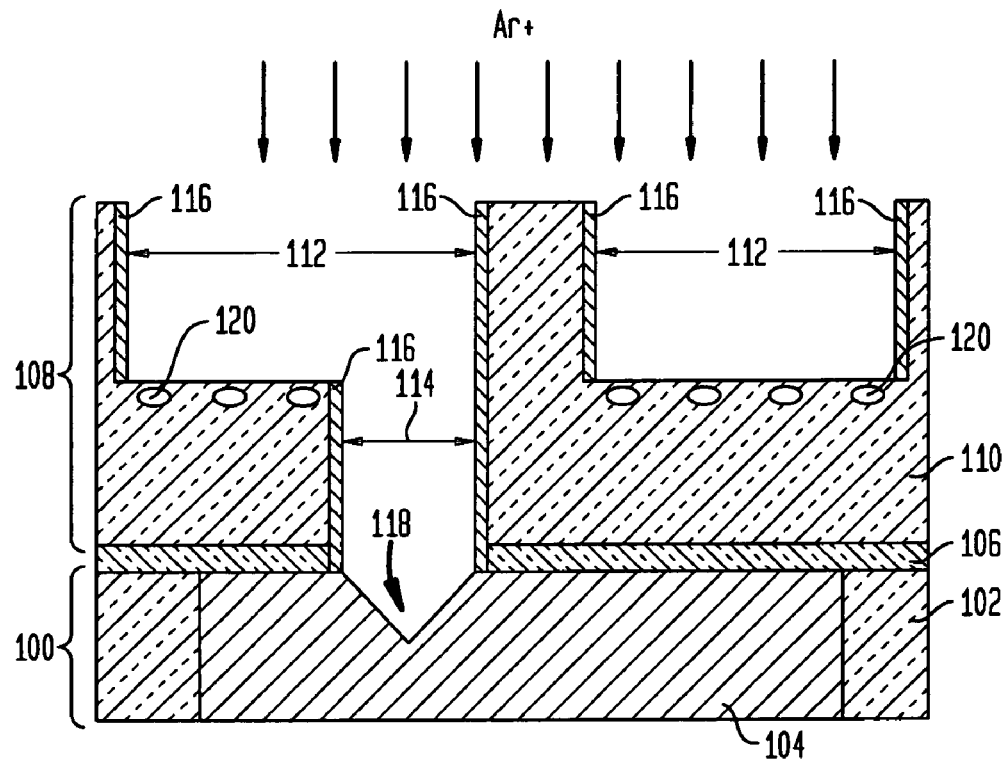
Figure 1D:
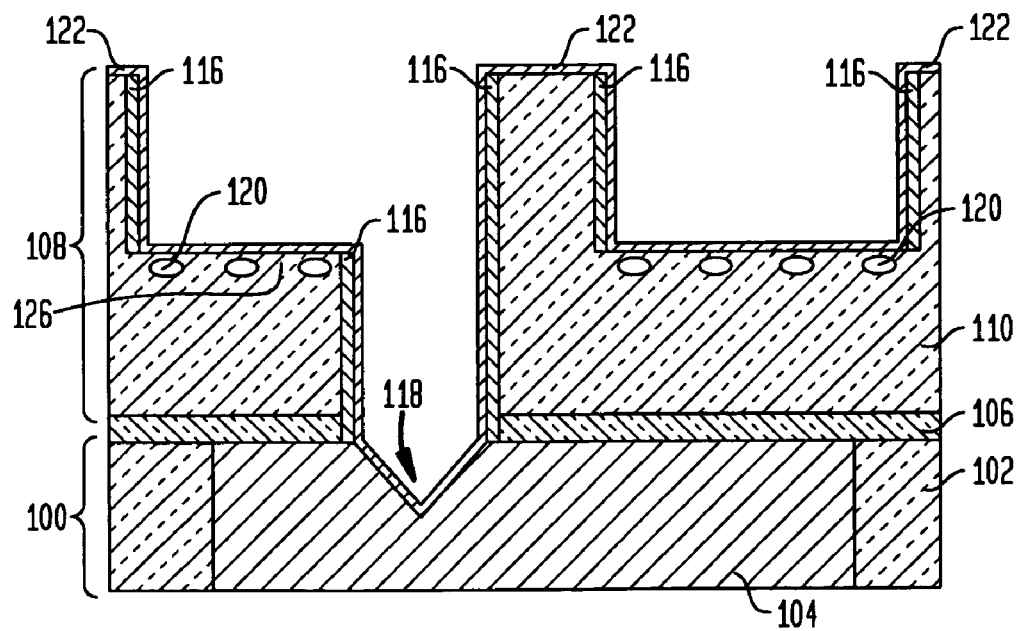
Figure 1E:
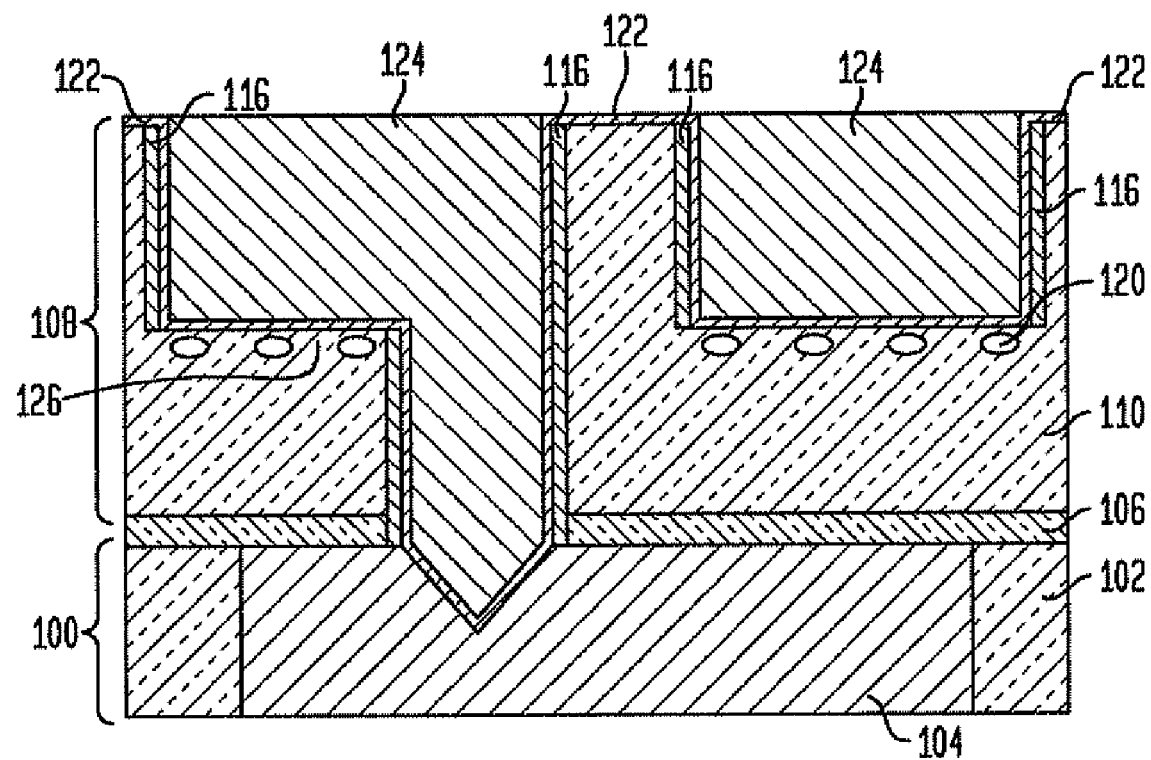
Figure 2:
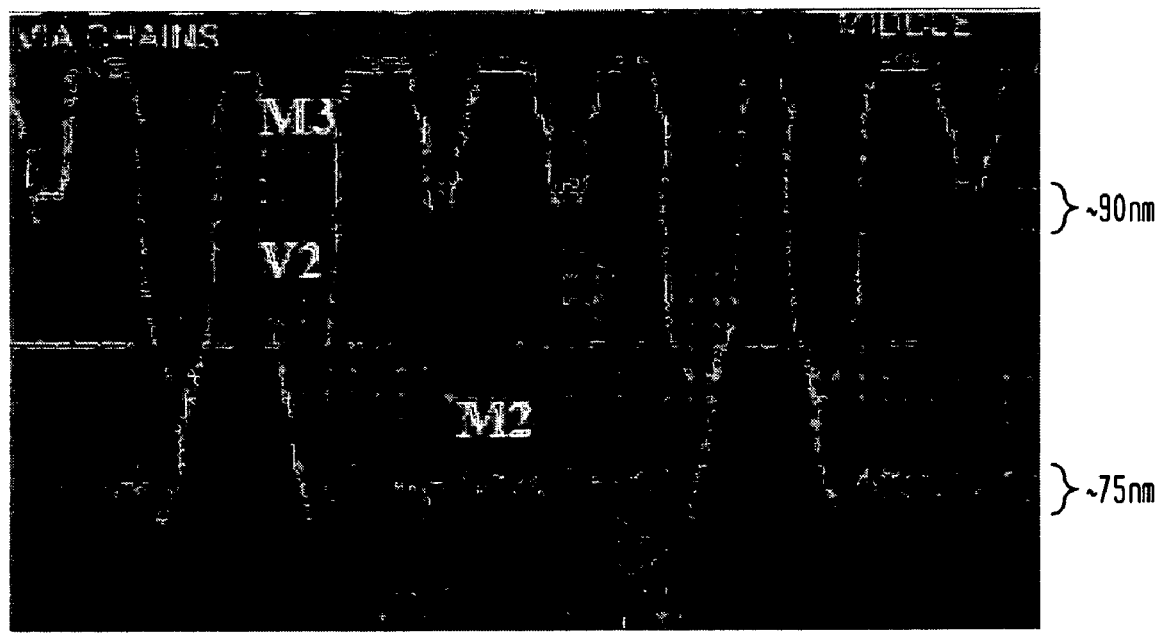
FIG. 2 is a SEM image (through a cross sectional view) illustrating a prior art interconnect structure with Cu interconnects in an ultra-low k dielectric.
Figure 3:
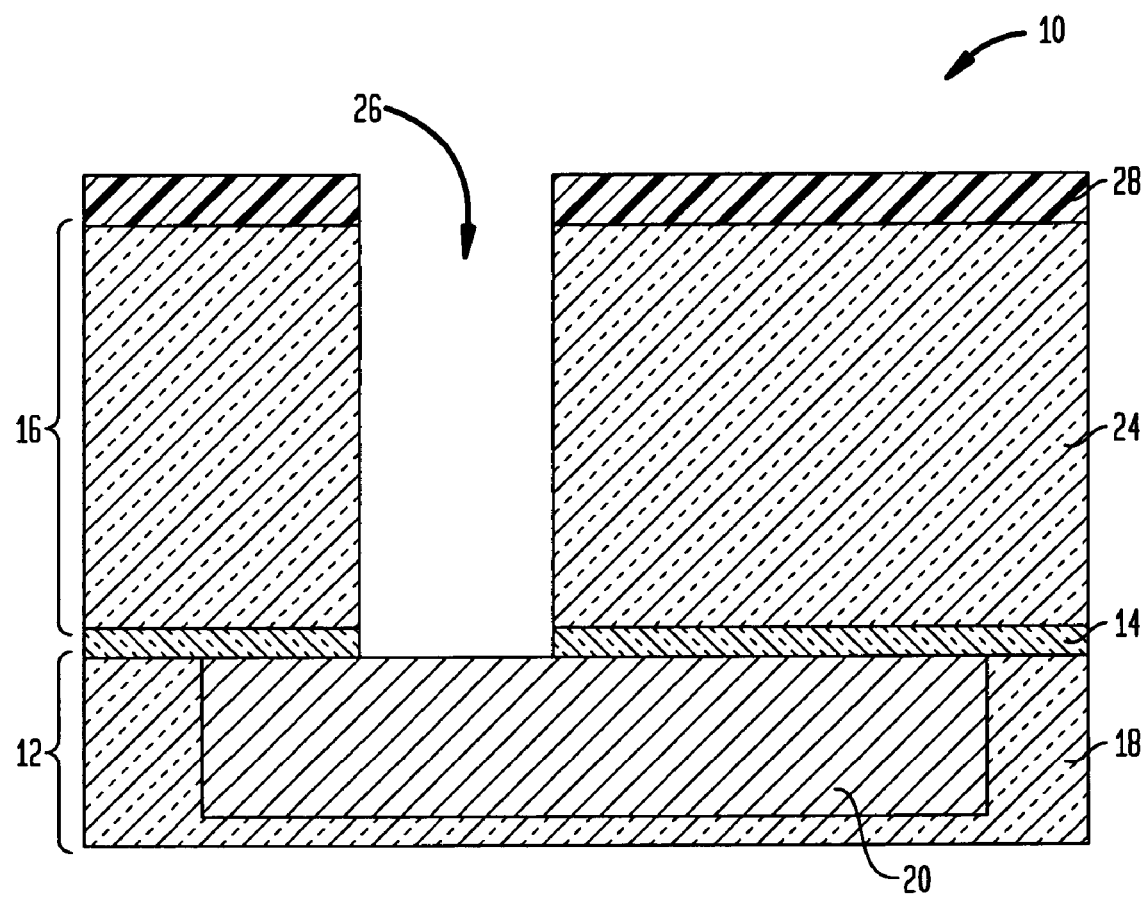
FIG. 3 is a pictorial representation (through a cross sectional view) illustrating an initial structure of the present invention after forming a via contact opening (herein after via opening) with an upper interconnect level.

The process flow of the present invention begins with providing the initial interconnect structure 10 shown in FIG. 3. Specifically, the initial interconnect structure 10 shown in FIG. 3 comprises a multilevel interconnect including a lower interconnect level 12 and an upper interconnect level 16 that are separated in part by a dielectric capping layer 14. The lower interconnect level 12, which may be located above a semiconductor substrate (not shown) including one or more semiconductor devices, comprises a first dielectric material 18 having at least one conductive feature (i.e., a conductive region) 20 that is separated from the first dielectric layer 18 by a barrier layer (not shown). The upper interconnect level 16 comprises a second dielectric material 24 that has at least one via opening 26 located therein. As is shown, the at least one via opening 26 exposes a portion of the conductive feature 20. Atop the upper interconnect level 16 is a patterned hard mask 28. Although the structure shown in FIG. 3 illustrates a single via opening 26, the present invention contemplates forming any number of such via openings in the second dielectric material 24 which exposes other conductive features 20 that may be present in the first dielectric material 18.

The initial structure 10 shown in FIG. 3 is made utilizing conventional techniques well known to those skilled in the art. For example, the initial interconnect structure can be formed by first applying the first dielectric material 18 to a surface of a substrate (not shown). The substrate, which is not shown, may comprise a semiconducting material, an insulating material, a conductive material or any combination thereof. When the substrate is comprised of a semiconducting material, any semiconductor such as Si, SiGe, SiGeC, SiC, Ge alloys, GaAs, InAs, InP and other II IV or II/VI compound semiconductors may be used. In addition to these listed types of semiconducting materials, the present invention also contemplates cases in which the semiconductor substrate is a layered semiconductor such as, for example, Si/SiGe, Si/SiC, silicon-on-insulators (SOIs) or silicon germanium-on-insulators (SGOIs).

When the substrate is an insulating material, the insulating material can be an organic insulator, an inorganic insulator or a combination thereof including multilayers. When the substrate is a conducting material, the substrate may include, for example, polySi, an elemental metal, alloys of elemental metals, a metal silicide, a metal nitride or combinations thereof including multilayers. When the substrate comprises a semiconducting material, one or more semiconductor devices such as, for example, complementary metal oxide semiconductor (CMOS) devices can be fabricated thereon.

The first dielectric material 18 of the lower interconnect level 12 may comprise any interlevel or intralevel dielectric including inorganic dielectrics or organic dielectrics. The first dielectric material 18 may be porous or non-porous, with porous dielectrics having a dielectric constant of about 2.8 or less being highly preferred in some embodiments of the present invention. Some examples of suitable dielectrics that can be used as the first dielectric material 18 include, but are not limited to: $SiO_2$, silsesquioxanes, C doped oxides (i.e., organosilicates) that include atoms of Si, C, O and H, thermosetting polyarylene ethers, or multilayers thereof. The term "polyarylene" is used in this application to denote aryl moieties or inertly substituted aryl moieties which are linked together by bonds, fused rings, or inert linking groups such as, for example, oxygen, sulfur, sulfone, sulfoxide, carbonyl and the like.

The first dielectric material 18 typically has a dielectric constant that is about 4.0 or less, with a dielectric constant of about 2.8 or less being even more typical. These dielectrics generally have a lower parasitic crosstalk as compared with dielectric materials that have a higher dielectric constant than 4.0. The thickness of the first dielectric material 18 may vary depending upon the dielectric material used as well as the exact number of dielectrics within the lower interconnect level 12. Typically, and for normal interconnect structures, the first dielectric material 18 has a thickness from about 200 to about 450 nm.

The lower interconnect level 12 also has at least one conductive feature 20 that is embedded in (i.e., located within) the first dielectric material 18. The conductive feature 20 comprises a conductive material that is separated from the first dielectric material 18 by a barrier layer (not shown). The conductive feature 20 is formed by lithography (i.e., applying a photoresist to the surface of the first dielectric material 18, exposing the photoresist to a desired pattern of radiation, and developing the exposed resist utilizing a conventional resist developer), etching (dry etching or wet etching) an opening in the first dielectric material 18 and filling the etched region with the barrier layer and then with a conductive material forming the conductive region. The barrier layer, which may comprise Ta, TaN, Ti, TiN, Ru, RuN, W, WN or any other material that can serve as a barrier to prevent conductive material from diffusing there through, is formed by a deposition process such as, for example, atomic layer deposition (ALD), chemical vapor deposition (CVD), plasma enhanced chemical vapor deposition (PECVD), physical vapor deposition (PVD), sputtering, chemical solution deposition, or plating.

The thickness of the barrier layer may vary depending on the exact means of the deposition process as well as the material employed. Typically, the barrier layer has a thickness from about 4 to about 40 nm, with a thickness from about 7 to about 20 nm being more typical.

Following the barrier layer formation, the remaining region of the opening within the first dielectric material 18 is filled with a conductive material forming the conductive feature 20. The conductive material used in forming the conductive feature 20 includes, for example, polySi, a conductive metal, an alloy comprising at least one conductive metal, a conductive metal silicide or combinations thereof. Preferably, the conductive material that is used in forming the conductive feature 20 is a conductive metal such as Cu, W or Al, with Cu or a Cu alloy (such as AlCu) being highly preferred in the present invention. The conductive material is filled into the remaining opening in the first dielectric material 18 utilizing a conventional deposition process including, but not limited to: CVD, PECVD, sputtering, chemical solution deposition or plating. After deposition, a conventional planarization process such as, for example, chemical mechanical polishing (CMP) can be used to provide a structure in which the barrier layer and the conductive feature 20 each have an upper surface that is substantially coplanar with the upper surface of the first dielectric material 18.

After forming the at least one conductive feature 20, a blanket dielectric capping layer 14 is formed on the surface of the lower interconnect level 12 utilizing a conventional deposition process such as, for example, CVD, PECVD, chemical solution deposition, or evaporation. The dielectric capping layer 14 comprises any suitable dielectric capping material such as, for example, SiC, $Si_4NH_3$, $SiO_2$, a carbon doped oxide, a nitrogen and hydrogen doped silicon carbide SiC(N, H) or multilayers thereof. The thickness of the capping layer 14 may vary depending on the technique used to form the same as well as the material make-up of the layer. Typically, the capping layer 14 has a thickness from about 15 to about 55 nm, with a thickness from about 25 to about 45 nm being more typical.

Next, the upper interconnect level 16 is formed by applying the second dielectric material 24 to the upper exposed surface of the capping layer 14. The second dielectric material 24 may comprise the same or different, preferably the same, dielectric material as that of the first dielectric material 18 of the lower interconnect level 12. The processing techniques and thickness ranges for the first dielectric material 18 are also applicable here for the second dielectric material 24. The second dielectric material 24 can also comprise two different materials, i.e., deposition of one dielectric material first, followed by deposition of a different dielectric material. In one embodiment of the present invention, the second dielectric material 24 comprises two different low k dielectric materials and thus the upper interconnect level 16 has a hybrid structure with the subsequently filled conductively filled line embedded in a porous dielectric material, and the subsequently filled via embedded in a dense (i.e., non porous) dielectric material. In such an embodiment, the porous low k dielectric has a dielectric constant of about 2.8 or less, and the dense porous low k dielectric has a dielectric constant of about 4.0 or less.

Next, at least one via opening 26 is formed into the second dielectric material 24 by first forming a blanket hard mask material atop the upper surface of the second dielectric material 24. The blanket hard mask material includes an oxide, nitride, oxynitride or any combination including multilayers thereof. Typically, the hard mask material is an oxide such as $SiO_2$ or a nitride such as $Si_3N_4$. The blanket hard mask material is formed utilizing a conventional deposition process such as, for example, CVD, PECVD, chemical solution deposition or evaporation. The thickness of the as-deposited hard mask material may vary depending upon the type of hard mask material formed, the number of layers that make up the hard mask material and the deposition technique used in forming the same. Typically, the as-deposited hard mask material has a thickness from about 10 to about 80 nm, with a thickness from about 20 to about 60 nm being even more typical.

After forming the blanket layer of hard mask material, a photoresist (not shown) is formed atop the hard mask material utilizing a conventional deposition process such as, for example, CVD, PECVD, spin-on coating, chemical solution deposition or evaporation. The photoresist may be a positive-tone material, a negative-tone material or a hybrid material, each of which is well known to those skilled in the art. The photoresist is then subjected to a lithographic process which includes exposing the photoresist to a pattern of radiation and developing the exposed resist utilizing a conventional resist developer. The lithographic step provides a patterned photoresist atop the hard mask material that defines the width of the via opening 26.

After providing the patterned photoresist, the via pattern is transferred into the hard mask material and then subsequently into the second dielectric material 24 utilizing one or more etching process. The patterned photoresist can be stripped immediately after the via pattern is transferred into the hard mask forming patterned hard mask 28 utilizing a conventional stripping process. Alternatively, the patterned photoresist can be stripping after the via pattern is transferred into the second dielectric material 24. The etching used in transferring the via pattern may comprise a dry etching process, a wet chemical etching process or a combination thereof. The term "dry etching" is used herein to denote an etching technique such as reactive-ion etching, ion beam etching, plasma etching or laser ablation.

Figure 4:
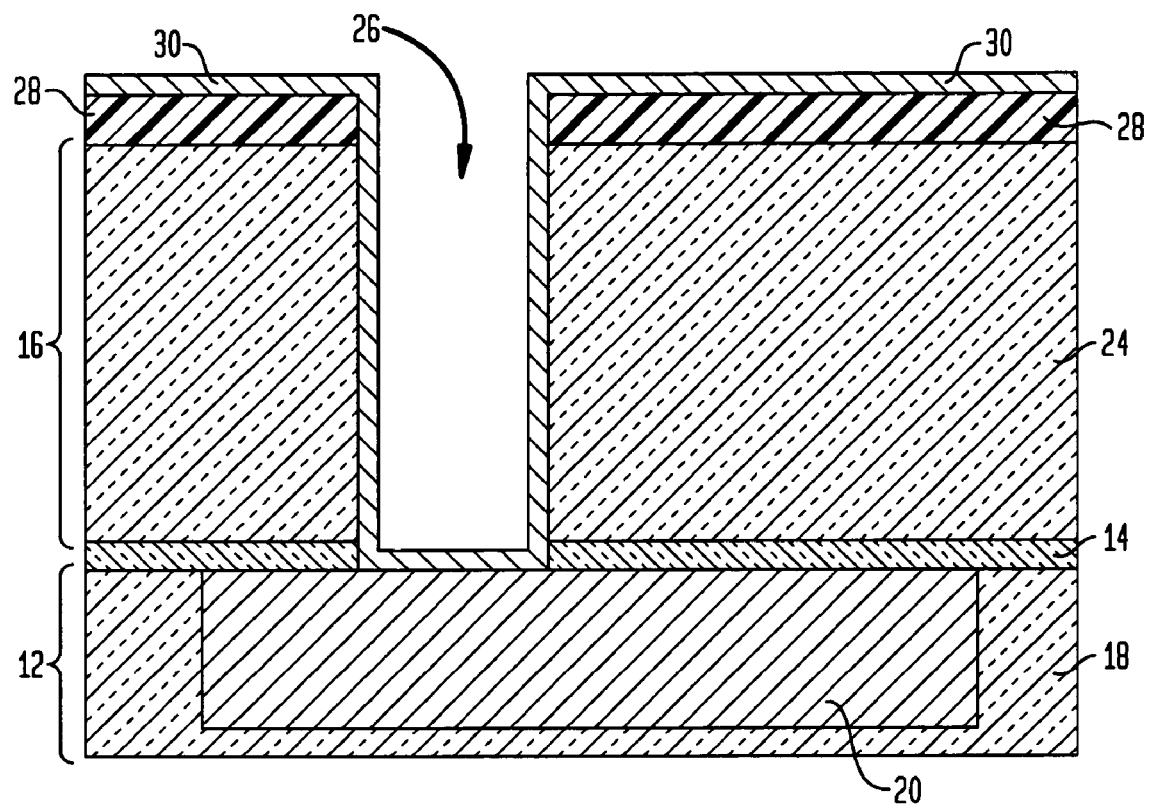
FIG. 4 is a pictorial representation (through a cross sectional view) illustrating the structure of FIG. 3 after forming a first diffusion barrier at least within the via opening.

After forming the initial interconnect structure 10 shown in FIG. 3, a layer of diffusion barrier material (which, for the purposes of the claimed invention, relates to a first diffusion barrier layer) 30 is then formed over all of the exposed surfaces of the initial interconnect structure providing the structure shown, for example, in FIG. 4. As is shown, diffusion barrier material 30 covers the exposed surfaces of the patterned hard mask 28, the sidewalls of the second dielectric material 24 within the via opening 26 as well as the exposed portion of the conductive feature 20. In accordance with the present invention, the diffusion barrier material 30 is a thin layer whose thickness is typically within the range from about 0.5 to about 20 nm, with a thickness from about 1 to about 10 nm being even more typical. The layer of diffusion barrier material 30 is formed utilizing a conventional deposition process including, but not limited to: CVD, PVD, ALD or spin-on coating. The diffusion barrier material 30 comprises a metal-containing material such as, for example, TaN, Ta, Ti, TiN, RuTa, RuTaN, W, Ru or Ir, an insulator such as, for example, $SiO_2$, $Si_3N_4$, SiC, SiC(N,H) or any combination thereof.

Following the formation of the diffusion barrier material 30, the structure shown in FIG. 4 is then subjected to an Ar sputtering process which removes the diffusion barrier material 30 from the bottom of the via and punches through the underlying conductive feature 20 so as to create a gouging feature (or anchoring area) 32 within the conductive feature 20. The resultant structure during the Ar sputtering process is shown, for example, in FIG. 5A. It is observed that; this sputtering process also removes diffusion barrier material 30 that is located on the horizontal surfaces of the hard mask 28. The second dielectric material 24 is not damaged during this process since it is protected by the hard mask 28. The Ar sputtering process utilized in forming the gouging feature 32 comprises any conventional Ar sputtering process that is typically used in interconnect technology to form such a feature. By way of illustration, Ar sputtering can be performed utilizing the following non-limiting conditions: gas flow of 20 sccm Ar, temperature of 25° C., bias of top electrode of 400 KHz and 750 W, table bias of 13.6 MHz and 400 W, and a process pressure of 0.6 mtorr. While Ar is shown for purpose of illustration, any other gas such as He, Ne, Xe, $N_2$, $H_2$, $NH_3$, $N_2H_2$, or mixtures thereof, can also be used for the sputtering process.

Figure 5A:
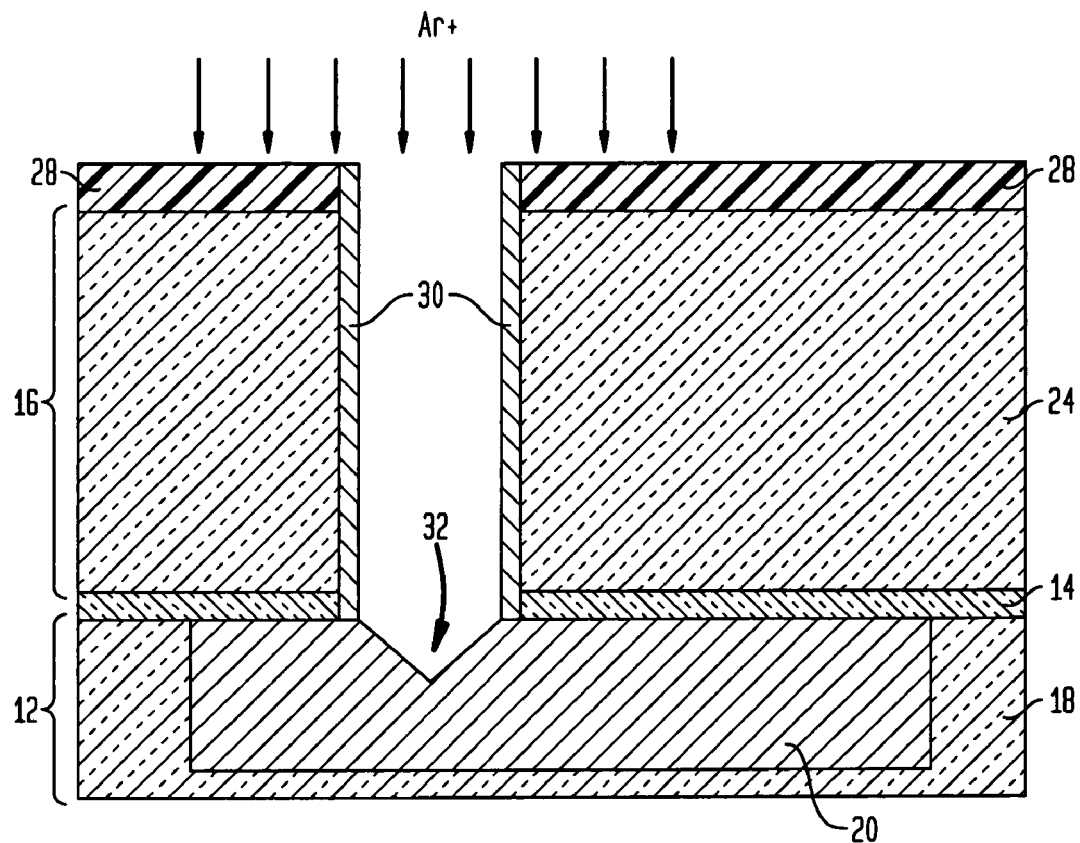
FIG. 5A is a pictorial representation (through a cross sectional view) illustrating the structure of FIG. 4 after sputtering to remove the first diffusion barrier from the bottom of the via contact opening and punching through into an underlying conductive feature forming a gouging; feature therein.
Figure 5B:
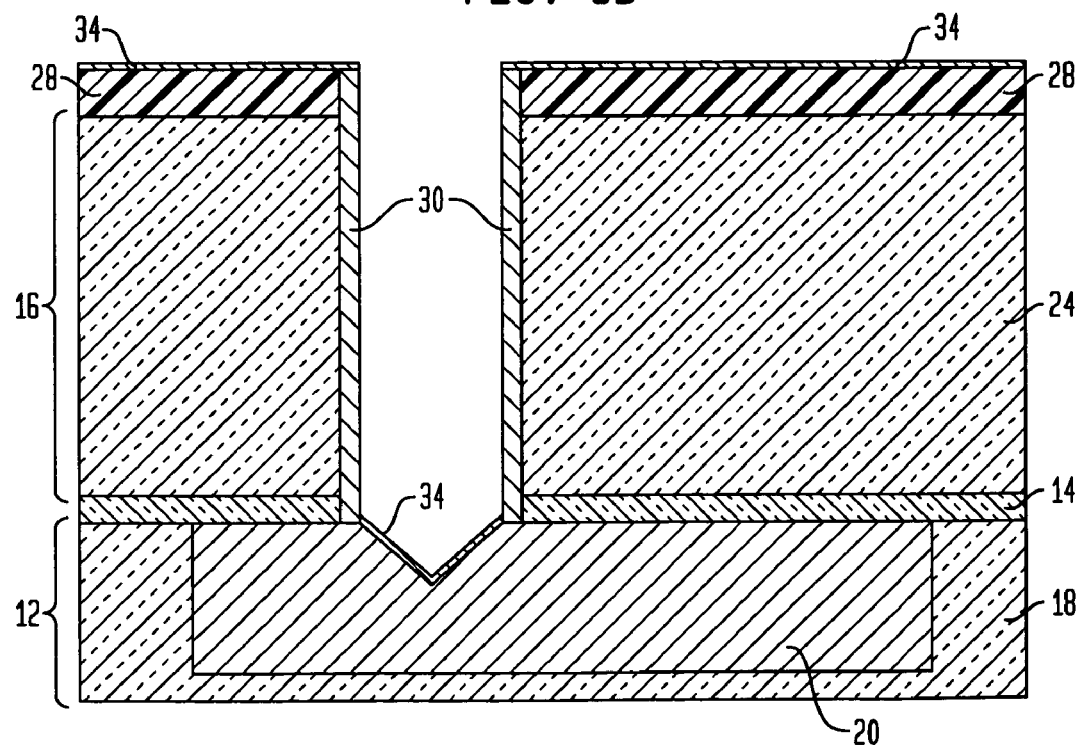
FIG. 5B shows an optional embodiment of the present invention in which a metallic interfacial layer is provided to the structure shown in FIG. 5A.

FIG. 5B shows an optional embodiment of the present invention in which a metallic interfacial layer 34 is formed on all the exposed surfaces shown in FIG. 5A. The metallic interfacial layer 34 is formed utilizing any conventional deposition process including, for example, CVD, PECVD, chemical solution deposition, evaporation, metalorgano deposition, ALD, sputtering, PVP or plating (electroless or electro). The thickness of the metallic interfacial layer 34 may vary depending on the exact metallic interfacial material used as well as the deposition technique that was used in forming the same. Typically, the metallic interfacial layer 34 has a thickness from about 0.5 to about 40 nm, with a thickness from about 1 to about 10 nm; being even more typical. The metallic interfacial layer 34 comprises a metallic barrier material such as, for example, Co, TaN, Ta, Ti, TiN, Ru, Ir, Au, Rh, Pt, Pd or Ag. Alloys of such materials are also contemplated.

Figure 6:
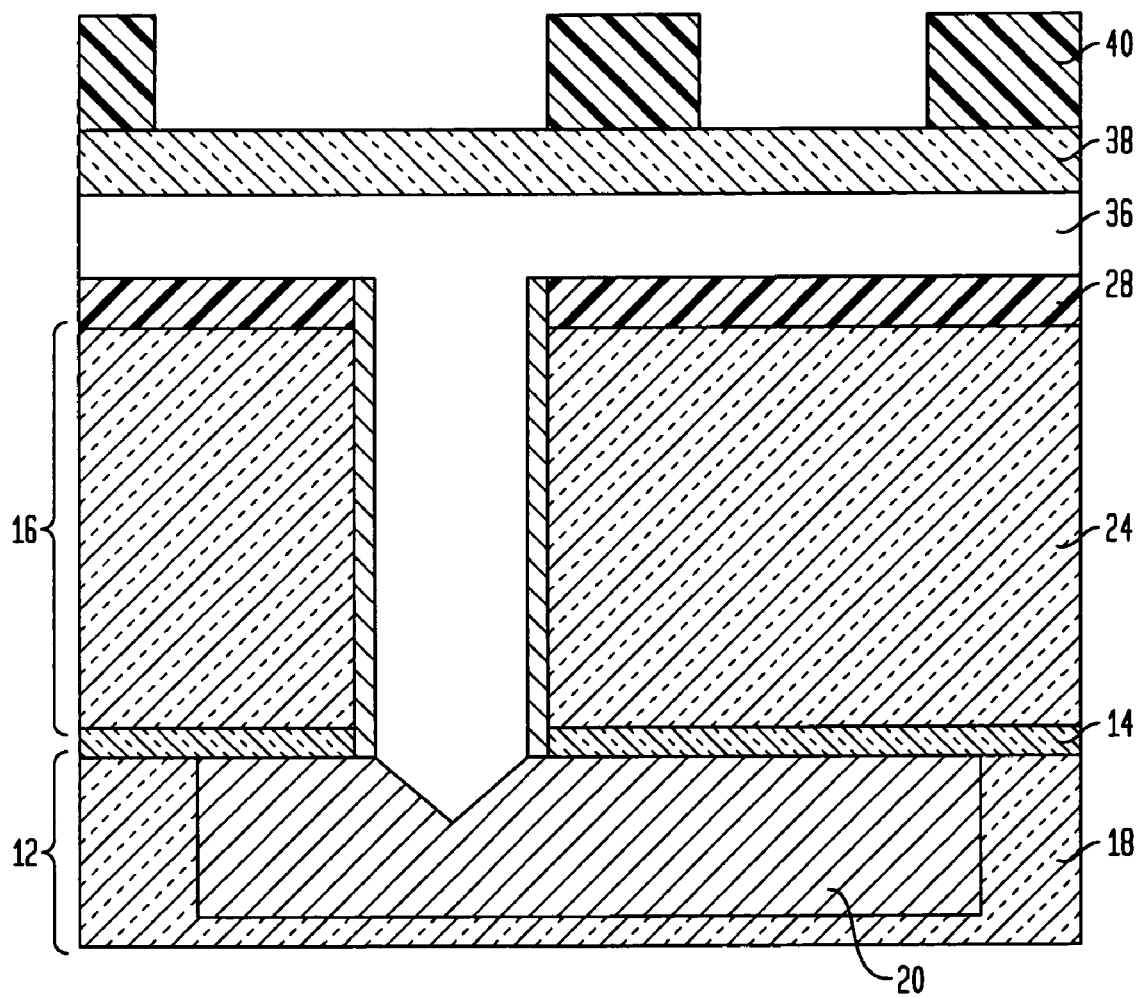
FIG. 6 is a pictorial representation (through a cross sectional view) illustrating the structure of FIG. 5A after formation of a planarization layer, hard mask and patterned photoresist.

Next, a planarization layer 36 is deposited filling the via opening 26 of either the structure shown in FIGS. 5A and 5B. The planarization layer 36 is deposited utilizing a conventional deposition process including, for example, CVD, PECVD, spin-on coating, evaporation or chemical solution deposition. The planarization material includes a conventional antireflective coating material or a spun-glass material. As shown in FIG. 6, the planarization layer 36 completes fills the via opening 26 as well as extending above the via opening 26 on either the exposed surface of the hard mask 28 (as shown in FIG. 6) or atop the metallic interfacial layer 34 (not shown).

In addition to the planarization layer 36, the structure shown in FIG. 6 also includes a second hard mask 38 disposed on a surface of the planarization layer 36 and a patterned photoresist 40 disposed on a surface of the second hard mask 38. The second hard mask 38 is formed utilizing the same processing techniques as described in forming the hard mask 28 and it is comprised of one of the hard mask materials mentioned above in connection with the hard mask 28. The patterned photoresist 40 is formed by deposition and lithography and it contains openings that have the width of a line opening.

Figure 7:
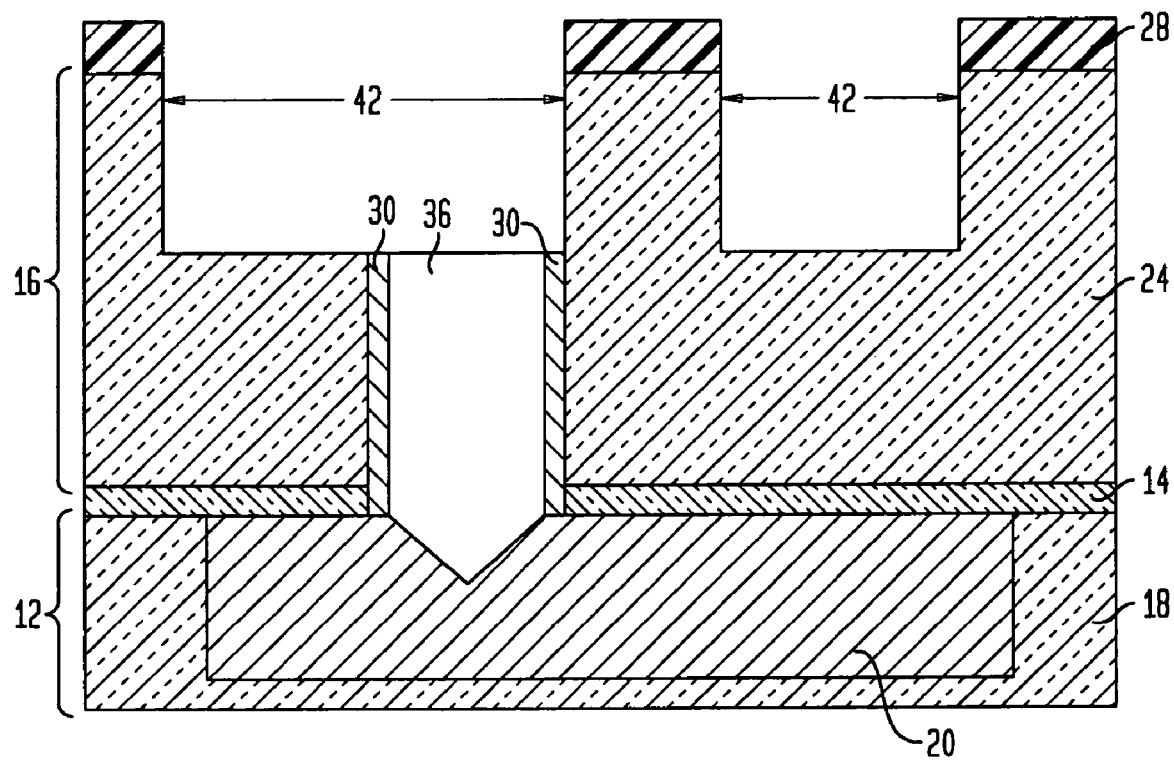
FIG. 7 is a pictorial representation (through a cross sectional view) illustrating the structure of FIG. 6 after creating at least one line opening within the upper interconnect level.

The structure shown in FIG. 6 is then subjecting to one or more etching processes which are capable of forming the structure shown in FIG. 7. As shown in this figure, the one or more etching processes form line openings 42 in the second dielectric material 24. In accordance with the present invention, at least one of the line openings 42 is located above and connect to the via opening 26, which is protected by the remaining planarization layer 36. The one or more etching steps remove, in sequential order, exposed portions of the second hard mask 38, the underlying portions of the planarization layer 36, and exposed portions of the second dielectric material 24. The patterned photoresist 40 and the patterned second hard mask 38 are typically consumed during the mentioned etching steps.

Figure 8:
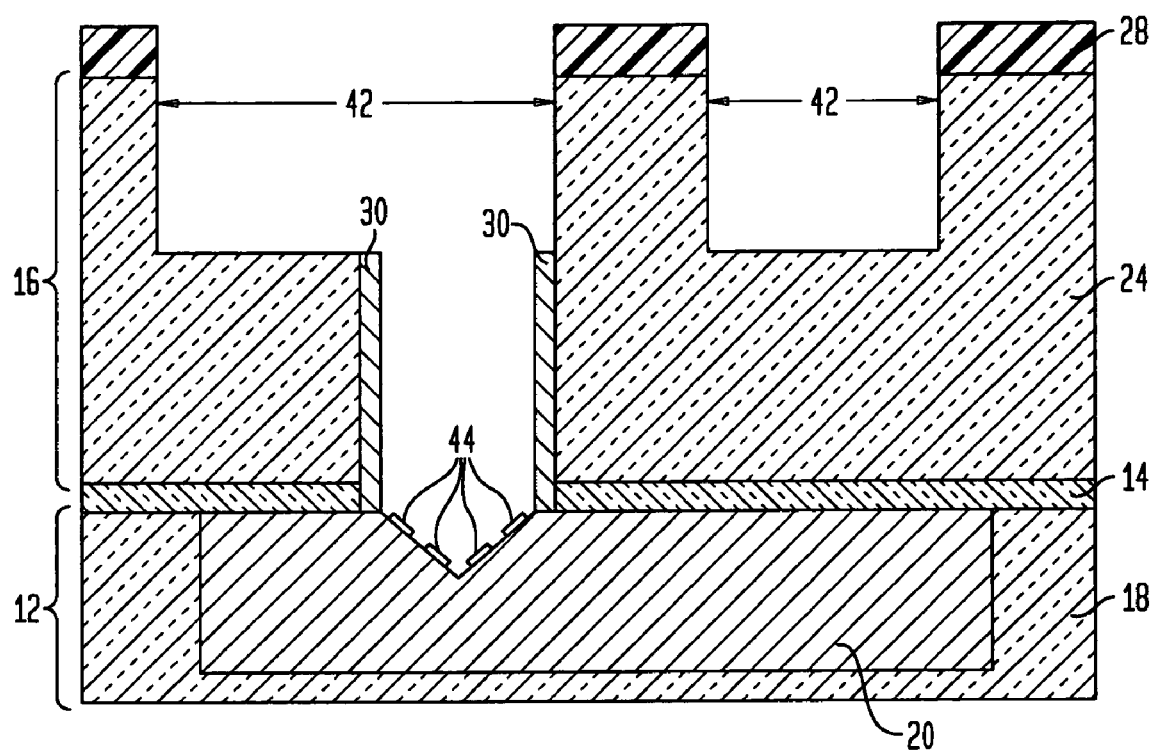
FIG. 8 is a pictorial representation (through a cross sectional view) illustrating the structure of FIG. 7 after removing remaining planarization material that protected the via opening during formation of the line opening. Possible residues are shown as being present in the via bottom.

FIG. 8 shows the structure of FIG. 7 after the remaining planarization layer 36 has been stripped from within the via opening 26. The stripping of the remaining planarization layer 36 is performed utilizing either a chemical wet etching process or a chemical ashing process that is selective in removing the planarizing material from the structure. In some embodiments of the present invention, oxide or etch residue 44 may remain in the gouging feature 32.

In such instances, the oxide or etch residue 44 can be removed from the gouging feature 32 utilizing a surface cleaning process that may include a wet chemical etching process and/or a slight Ar bombardment. No damage occurs in this instance since the Ar bombardment conditions are not as harsh as that used in the prior art in forming the gouging feature 32. Typically, the process time used in the present case for only surface cleaning is less than 5 seconds compared to longer than 10 seconds for creating the gouging feature used in the prior art. By way of illustration, Ar sputtering can be performed utilizing the following non-limiting conditions: gas flow of 20 sccm Ar, temperature of 25° C., bias of top electrode of 400 KHz and 400 W, table bias of 13.6 MHz and 200 W, and a process pressure of 0.6 mtorr. While Ar is shown for purpose of illustration, any other gas such as He, Ne, Xe, $N_2$, $H_2$, $NH_3$, $N_2H_2$ or mixtures thereof, can also be used for the sputtering process.

Figure 9:
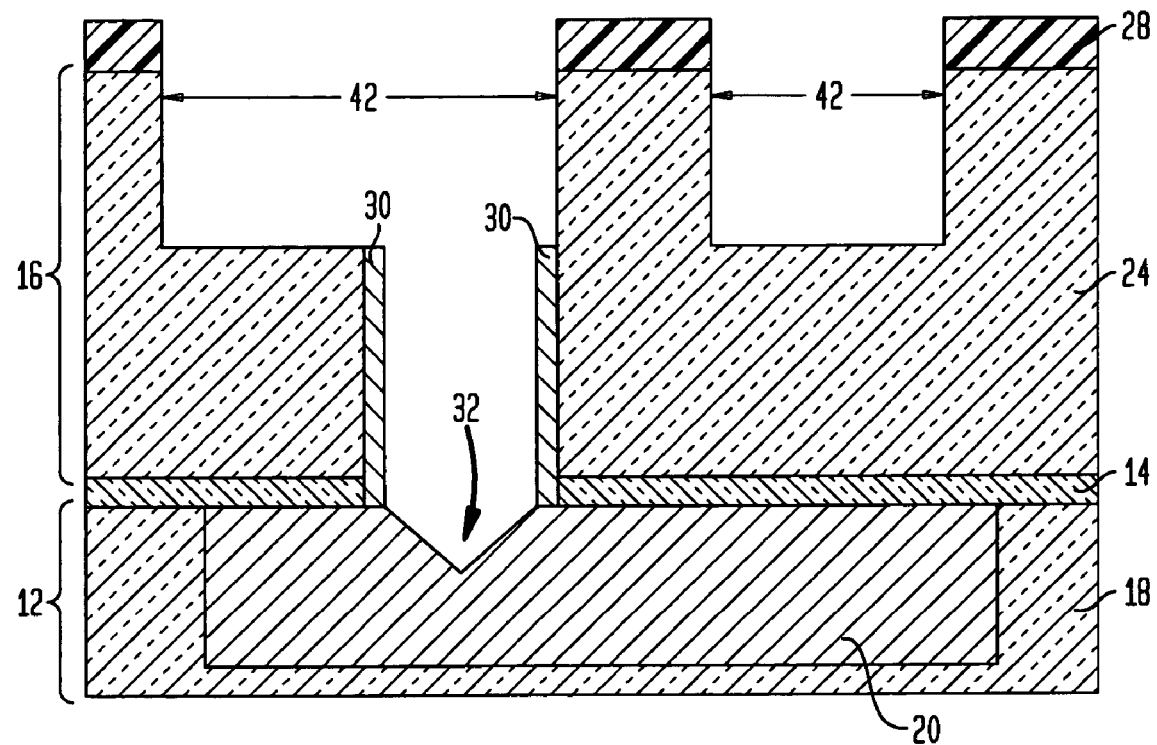
FIG. 9 is a pictorial representation (through a cross sectional view) illustrating the structure of FIG. 8 after removing the via bottom oxides/residues.

In some embodiments of the present invention, etching residues are removed from the at least one line opening and from the at least one via opening area. In one embodiment, plasma etching, which contains at least one or combination of $O_2$, $H_2$, $N_2$, CO, $CO_2$, or $NH_3$ is employed. In another embodiment, the etching residues are removed by a wet clean, which contains at least one or combination of HF, HCl, $H_2SO_4$, or $HNO_3$. FIG. 9 shows the resultant structure after performing such a cleaning process.

Figure 10A:
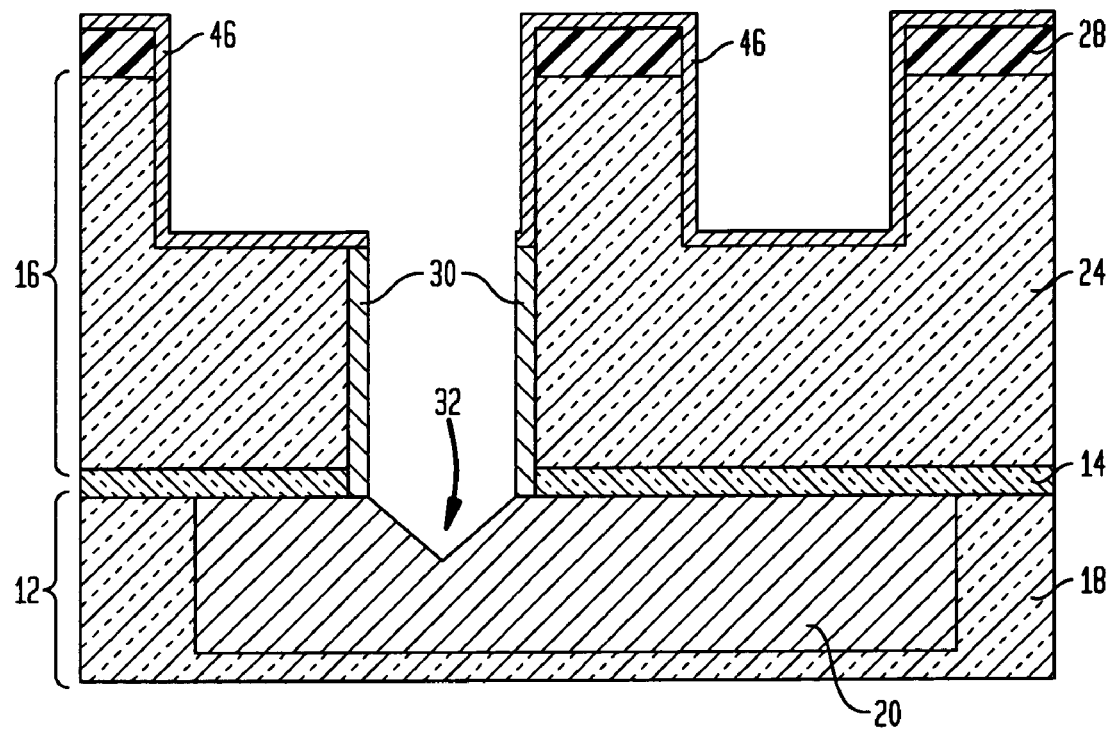
FIGS. 10A-10B are pictorial representations (through cross sectional views) illustrating structures of FIG. 9 that are formed after formation of a second diffusion barrier.
Figure 10B:
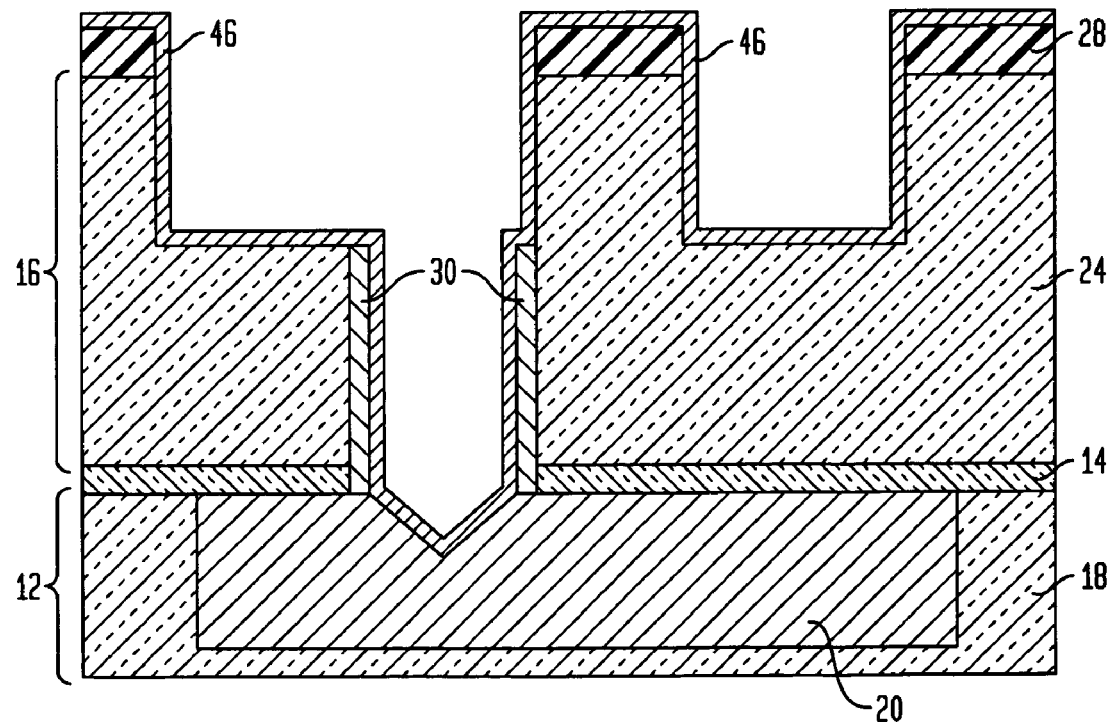

FIGS. 10A and 10B shows two different structures that can be formed next. Both of the structures shown in FIGS. 10A and 10B include a diffusion barrier 46 (for the purposes of the claimed invention, the diffusion barrier 46 represents a second diffusion barrier). As shown in FIG. 10A, the diffusion barrier 46 only covers the exposed surfaces within the line openings 42, while in FIG. 10B the diffusion barrier 46 covers the exposed surfaces within both the line openings 42 and the via openings 26. The extent of the diffusion barrier 46 coverage is determined by the conditions and length of the deposition process used in forming the same. It is noted that the diffusion barrier 46 is continuously present in the line openings 42 throughout the inventive process.

In accordance with the present invention, the diffusion barrier 46 comprises Ta, TaN, Ti, TiN, Ru, RuN, RuTa, RuTaN, W, WN or any other material that can serve as a barrier to prevent a conductive material from diffusing there through. Combinations of these materials are also contemplated forming a multilayered stacked diffusion barrier. The diffusion barrier 46 is formed utilizing a deposition process such as, for example, atomic layer deposition (ALD), chemical vapor deposition (CVD), plasma enhanced chemical vapor deposition (PECVD), physical vapor deposition (PVD), sputtering, chemical solution deposition, or plating.

The thickness of the diffusion barrier 46 may vary depending on the number of material layers within the barrier, the technique used in forming the same as well as the material of the diffusion barrier itself. Typically, the diffusion barrier 46 has a thickness from about 4 to about 40 nm, with a thickness from about 7 to about 20 nm being even more typical.

Figure 11A:
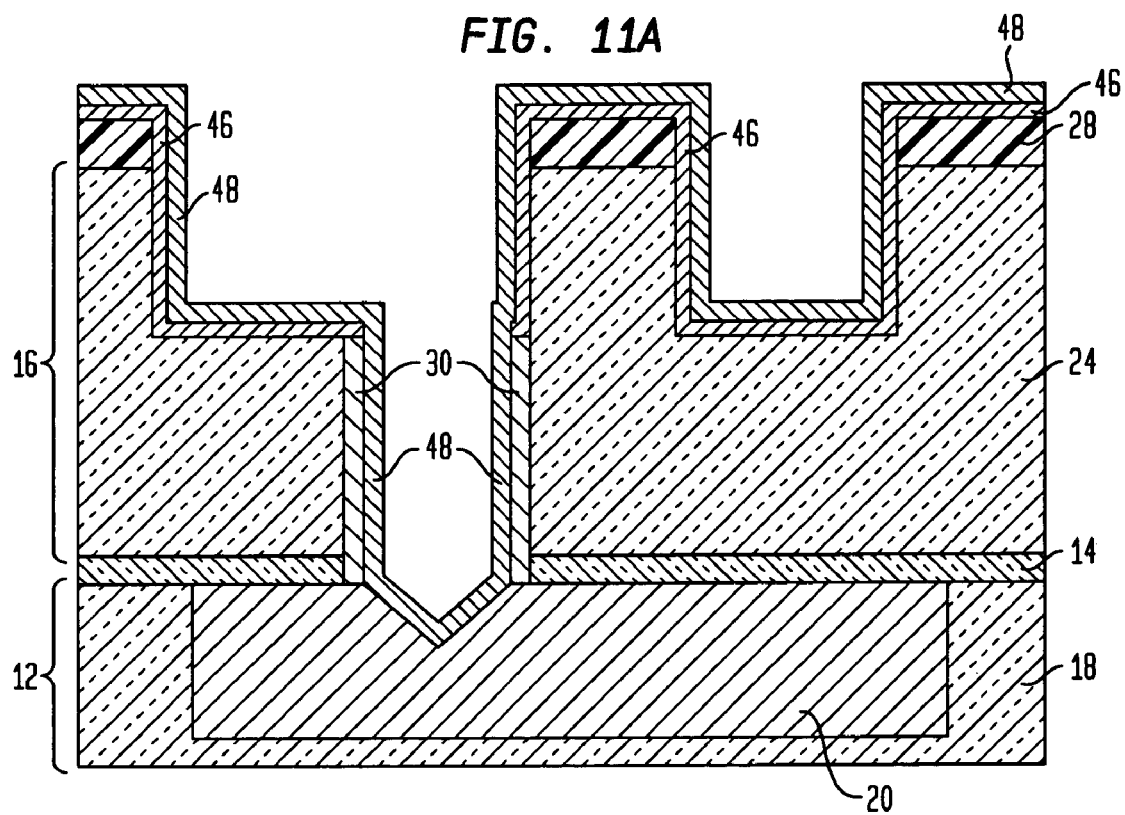
FIGS. 11A-11B are pictorial representations (through cross sectional views) illustrating structures of FIGS. 10A and 10B, respectively that are formed after formation of an adhesion/plating seed layer.
Figure 11B:
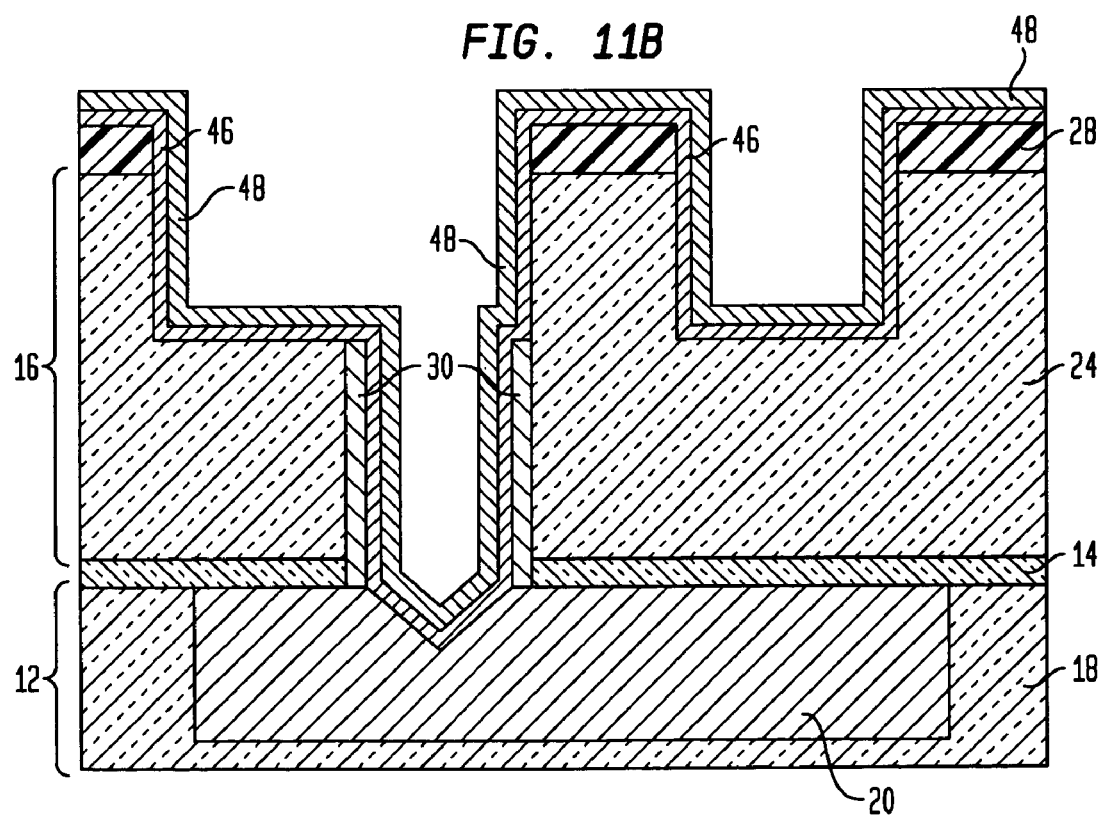

FIGS. 11A and 11B shows two different structures that can be formed next from the structures shown in FIGS. 10A and 10B, respectively. Both of the structures shown in FIGS. 11A and 11B include an adhesion/plating seed layer 48.

The adhesion/plating seed layer 48 is comprised of a metal or metal alloy from Group VIIIA of the Periodic Table of Elements. Examples of suitable Group VIIIA elements for the adhesion/plating seed layer include, but are not limited to: Ru, TaRu, Ir, Rh, Pt, Pd and alloys thereof. In some embodiments, it is preferred to use Ru, Ir or Rh as layer 48.

The adhesion/plating seed layer 48 is formed by a conventional deposition process including, for example, chemical vapor deposition (CVD), plasma enhanced chemical vapor deposition (PECVD), atomic layer deposition (ALD), plating, sputtering and physical vapor deposition (PVP). The thickness of the adhesion/plating seed layer 48 may vary depending on number of factors including, for example, the compositional material of the adhesion/plating seed layer 48 and the technique that was used in forming the same. Typically, the adhesion/plating seed layer 48 has a thickness from about 0.5 to about 10 nm, with a thickness of less than 6 nm being even more typical.

Figure 12A:
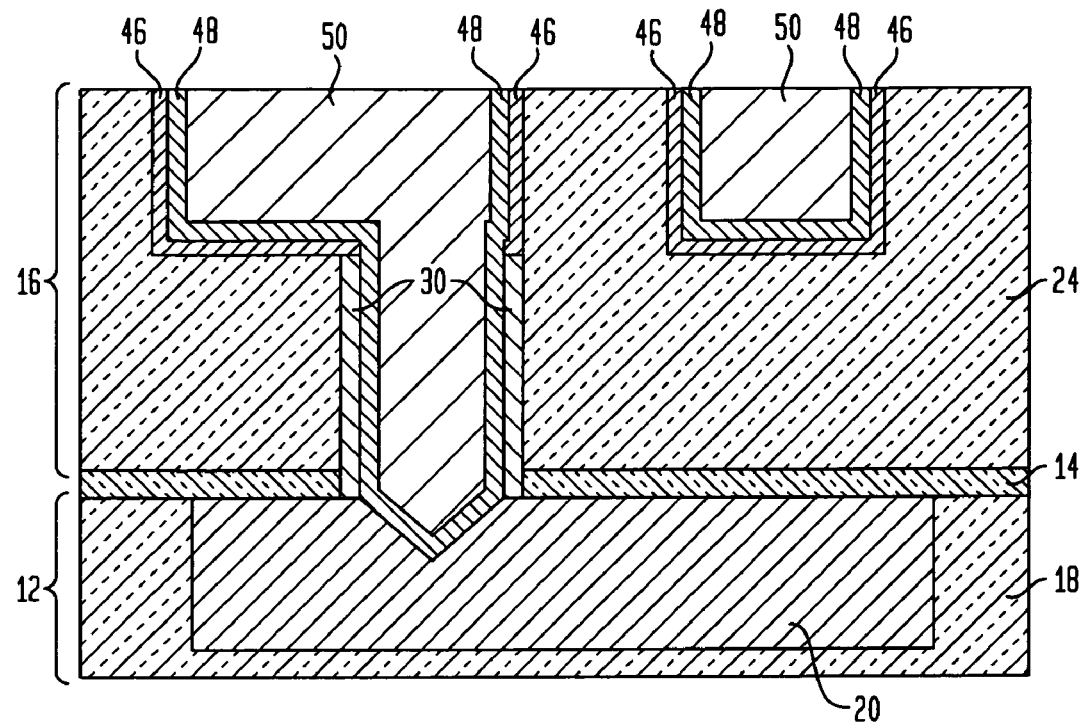
FIGS. 12A-12B are pictorial representations (through cross sectional views) illustrating structures of FIGS. 11A and 11B, respectively that are formed after metallic fill and planarization.
Figure 12B:
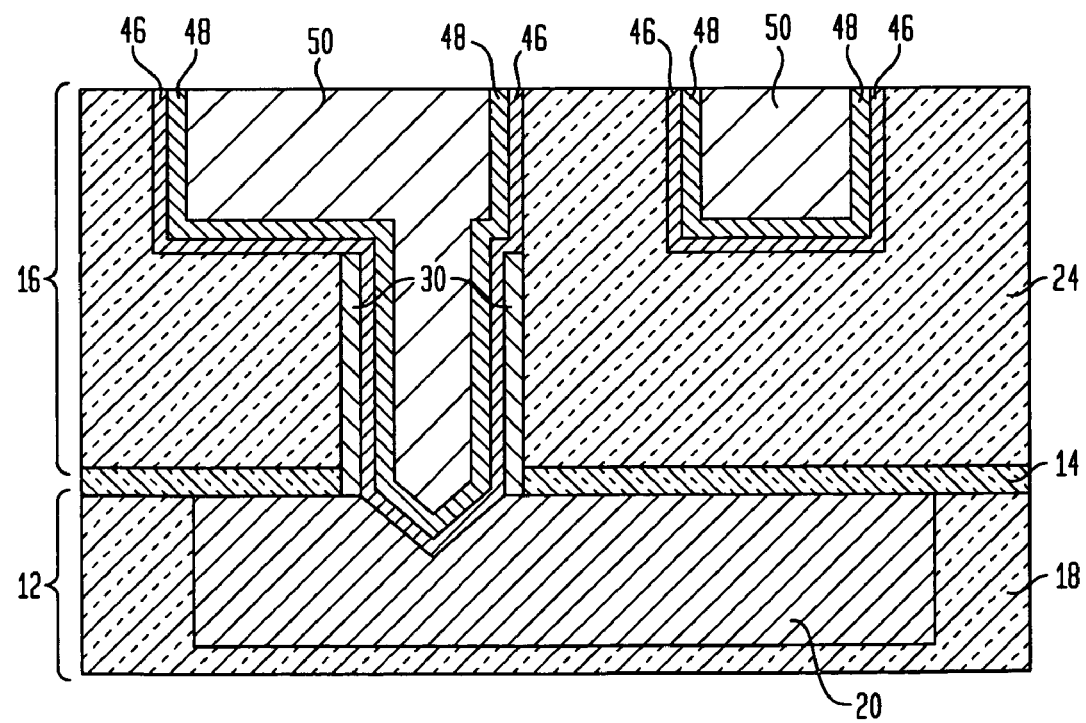

FIGS. 12A and 12B shows different interconnect structures that can be formed from the structures shown in FIGS. 11A and 11B, respectively. Each of the illustrated structures shown in FIGS. 12A and 12B is after filling the via and line openings as well as the gouging feature 32 with an interconnect conductive material 50 and planarization. The interconnect conductive material 50 may comprise the same or different, preferably the same, conductive material (with the proviso that the conductive material is not polysilicon) as that of the conductive feature 20. Preferably, Cu, Al, W or alloys thereof are used, with Cu or AlCu being most preferred. The conductive material 50 is formed utilizing the same deposition processing as described above in forming the conductive feature 20 and following deposition of the conductive material, the structure is subjected to planarization. The planarization process removes various materials that are located atop the second low k dielectric material 24 of the upper interconnect level 16.

The method of the present application is applicable in forming additional interconnect levels atop the levels depicted in FIGS. 3-12B. Each of the various interconnect levels would include the gouging feature described hereinabove.

Because of the integration processing scheme described above, no damaged regions are formed into the second dielectric material 24 during the formation of the gouging feature 32. Moreover, the inventive integration process allows for continuous coverage of the diffusion barrier 46 in the metallic line regions which has a uniform thickness (i.e., a thickness variation of less than 2 nm). Since diffusion barrier 46 coverage is continuous in the line regions of the inventive interconnect structure and no damages are introduced into the interconnect dielectric material, the inventive interconnect structure has an improved wiring reliability and a lower-level of metal-metal leakage than the interconnect structure shown in FIGS. 1A-1E. It should be also noted that diffusion barrier material 30 is only present inside the via openings 26, but is not present in the line openings 42. This feature enhances both mechanical strength and diffusion property around the via opening areas without decreasing volume fraction of conductor 50 inside the line openings 42. It is further noted that in some embodiments the total diffusion barrier thickness of the first diffusion barrier layer 30 and the second continuous diffusion barrier 46 within the conductively filled via is thicker than the second continuous diffusion barrier 46 within the conductively filled line.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

What is claimed is:

1. A method of fabricating a semiconductor structure comprising:

providing an initial interconnect structure that includes a lower interconnect level comprising a first dielectric layer having at least one conductive feature embedded therein, an upper interconnect level comprising a second dielectric having at least one via opening that exposes a portion of said at least one conductive feature located atop said lower interconnect level, said lower and upper interconnect levels are separated in part by a dielectric capping layer, and a patterned hard mask on a surface of the said upper interconnect level;

forming a first barrier layer on all exposed surfaces of the initial interconnect structure;

forming a punch-through gouging feature in said at least one conductive feature that is located at the bottom of said via opening;

forming at least one line opening in said second dielectric material that extends above said at least one via opening;

forming a second continuous diffusion barrier layer at least within said at least one line opening;

forming an adhesion/plating seed layer within both said at least one line opening and said at least one via opening;

filling said at least one line opening and at least one via opening with a conductive material; and performing a planarization step after said filling with said conductive material, wherein said planarization step removes said patterned hard mask and provides a conductive filled line that has an upper surface that is coplanar with an upper exposed surface of said second dielectric material.

2. The method of claim 1 wherein said providing said initial interconnect structure includes forming at least one conductive feature within said first dielectric material, forming a blanket dielectric capping layer on said first dielectric material, forming said second dielectric material on said blanket dielectric capping layer, forming a patterned hard mask having via patterns on said second dielectric material, and transferring said via patterns into said second dielectric material and said blanket dielectric capping layer.

3. The method of claim 1 wherein said forming said first barrier layer comprising depositing a metal-containing or insulating material.

4. The method of claim 1 wherein said forming said punch-through gouging feature comprises gaseous sputtering comprising one of Ar, He, Ne, Xe, $N_2$, $H_2$, $NH_3$, $N_2H_2$ and mixtures thereof 5. The method of claim 1 wherein said forming said at least one line opening comprising filling said at least one via opening with a planarization material, said planarization material extending above said via opening, forming a second hard mask on said planarization material, forming a patterned photoresist having a line pattern on said second hard mask, and transferring said line pattern to said second hard mask and an upper portion of said second dielectric material.

6. The method of claim 1 wherein said second continuous diffusion barrier layer is also present in said at least one via opening.

7. The method of claim 1 wherein said second continuous diffusion barrier layer is formed by depositing at least one of Ta, TaN, Ti, TiN, Ru, RuN, RuTa, RuTaN, W and WN.

8. The method of claim 1 wherein said forming said adhesion/plating seed layer comprises depositing one or a combination of Ru, TaRu, Ir, Rh, Pt, Pd, Cu or alloys thereof.

9. The method of claim 1 wherein filling said at least one line opening and said at least one via opening comprises depositing at least one of Cu, Al, W and alloys thereof.

10. A method of fabricating a semiconductor structure comprising:
    providing an initial interconnect structure that includes a lower interconnect level comprising a first dielectric layer having at least one conductive feature embedded therein, an upper interconnect level comprising a second dielectric having at least one via opening that exposes a portion of said at least one conductive feature located atop said lower interconnect level, said lower and upper interconnect levels are separated in part by a dielectric capping layer, and a patterned hard mask on a surface of the said upper interconnect level;
    forming a first barrier layer on all exposed surfaces of the initial interconnect structure;
    forming a punch-through gouging feature in said at least one conductive feature that is located at the bottom of said via opening;
    forming a metallic interfacial layer atop said gouging feature;
    forming at least one line opening in said second dielectric material that extends above said at least one via opening;
    removing etching residues from said at least one line opening and from said at least one via opening;
    forming a second continuous diffusion barrier layer at least within said at least one line opening;
    forming an adhesion/plating seed layer within both said at least one line opening and said at least one via opening;
    filling said at least one line opening and at least one via opening with a conductive material; and
    performing a planarization step after said filling with said conductive material, wherein said planarization step removes said patterned hard mask and provides a conductive filled line that has an upper surface that is coplanar with an upper exposed surface of said second dielectric material.

11. The method of claim 10 wherein said metallic interfacial layer is formed by depositing at least one or a combination of Co, Ru, Ir, Rh, Pt, Pd, Ta or alloys thereof.

12. The method of claim 10 wherein said metallic interfacial layer is formed by PVD, CVD, ALD, electro plating, and electroless plating.

13. The method of claim 10 wherein said removing etching residues from said at least one line opening and from said at least one via opening area is done by plasma, which contains at least one or a combination of $O_2$, $H_2$, $N_2$, or $NH_3$.

14. The method of claim 10 wherein said removing etching residues from said at least one line opening and from said at least one via opening area is done by wet clean, which contains at least one or a combination of HF, HCl, $H_2SO_4$, or $HNO_3$.

* * * * *